United States Patent [19]
Robinson et al.

[11] 4,001,076
[45] Jan. 4, 1977

[54] METHOD FOR GROWING THIN EPITAXIAL LAYERS OF A NON-LINEAR, OPTICALLY ACTIVE MATERIAL

[75] Inventors: Lawrence B. Robinson, Cambridge; William Powazinik, Marlboro, both of Mass.

[73] Assignee: GTE Laboratories Incorporated, Waltham, Mass.

[22] Filed: Dec. 11, 1974

[21] Appl. No.: 531,570

[52] U.S. Cl. .................. 156/624; 156/DIG. 71; 23/273 SP; 23/302 R; 423/65; 423/184; 156/622

[51] Int. Cl.[2] .................. B01J 17/20; C01D 11/02; C01G 35/00; C01G 57/00

[58] Field of Search .......... 156/617, 624, 621, 622, 156/DIG. 63, DIG. 71, 617 H; 23/301 SP, 273 SP, 305 RE, 302; 423/184, 65

[56] References Cited
UNITED STATES PATENTS

| 3,346,344 | 10/1967 | Levinstein | 156/DIG. 71 |
| 3,446,603 | 5/1969 | Loiacono | 156/DIG. 71 |
| 3,486,937 | 12/1969 | Linares | 156/622 |
| 3,607,752 | 9/1971 | Graenicher | 156/DIG. 71 |
| 3,790,405 | 2/1974 | Levinstein | 156/624 |
| 3,791,887 | 2/1974 | Deitch | 156/622 |
| R28,140 | 8/1974 | Bergh | 156/622 |

OTHER PUBLICATIONS

Matthias et al., Physical Review, Ferroelectricity in the Illumenite Structure, vol. 76, pp. 1886–1887 (1949).
Kaminow et al., Appl. Phys. Lett., vol. 22, No. 7, Apr. 1, 1973, Optical Waveguiding Layers in $LiNbO_3$ & $LiTaO_3$, pp. 326–328.
Kaminow et al., App. Phy. Lett., vol. 22, No. 10, May 15, 1973, pp. 540–543.
Fukuda et al., Jap. Journal of App. Phy. vol. 11, No. 2, Feb. 1972 (English) pp. 163–169, Prep. of $KNbO_3$ Single Crystal for Optical Application.
Ballman et al., J. of Am. Cer. Soc., vol. 50, No. 12, Dec. 1967, pp. 657 thru 659.
Miyazawa, App. Phy. Lett., vol. 23, No. 4, Aug. 15, 1973, pp. 198 to 200.

*Primary Examiner*—Stephen J. Emery
*Attorney, Agent, or Firm*—Irving M. Kriegsman

[57] ABSTRACT

Thin film epitaxial layers of mixed oxide compounds, or of solid solutions of two mixed oxides, are deposited on a suitable single crystal substrate. Growth is achieved by introducing the substrate into a crucible containing a saturated solution of the oxide(s) in a molten alkali metal halide having additional undissolved oxide(s) present in the crucible. Evaporation of the alkali metal halide solvent produces and/or maintains the supersaturated condition, which is relieved by epitaxial deposition of the oxide(s) onto the substrate. When two mixed oxides are dissolved in the solvent, the composition of the film is determined and fixed by the temperature of growth. To produce a thin film of a constant composition, growth is conducted isothermally. To produce a thin film with a graded composition throughout its thickness, growth is conducted by slowly cooling the temperature of the solution. Excess, undissolved oxide is kept in a region of the crucible such that the undissolved oxide is several degrees hotter than the liquid in contact with the substrate. This condition results in additional oxide dissolving in the solvent as elsewhere the oxide is being deposited onto the substrate. This method of epitaxial growth provides good control of both the film composition and the film thickness.

23 Claims, 1 Drawing Figure

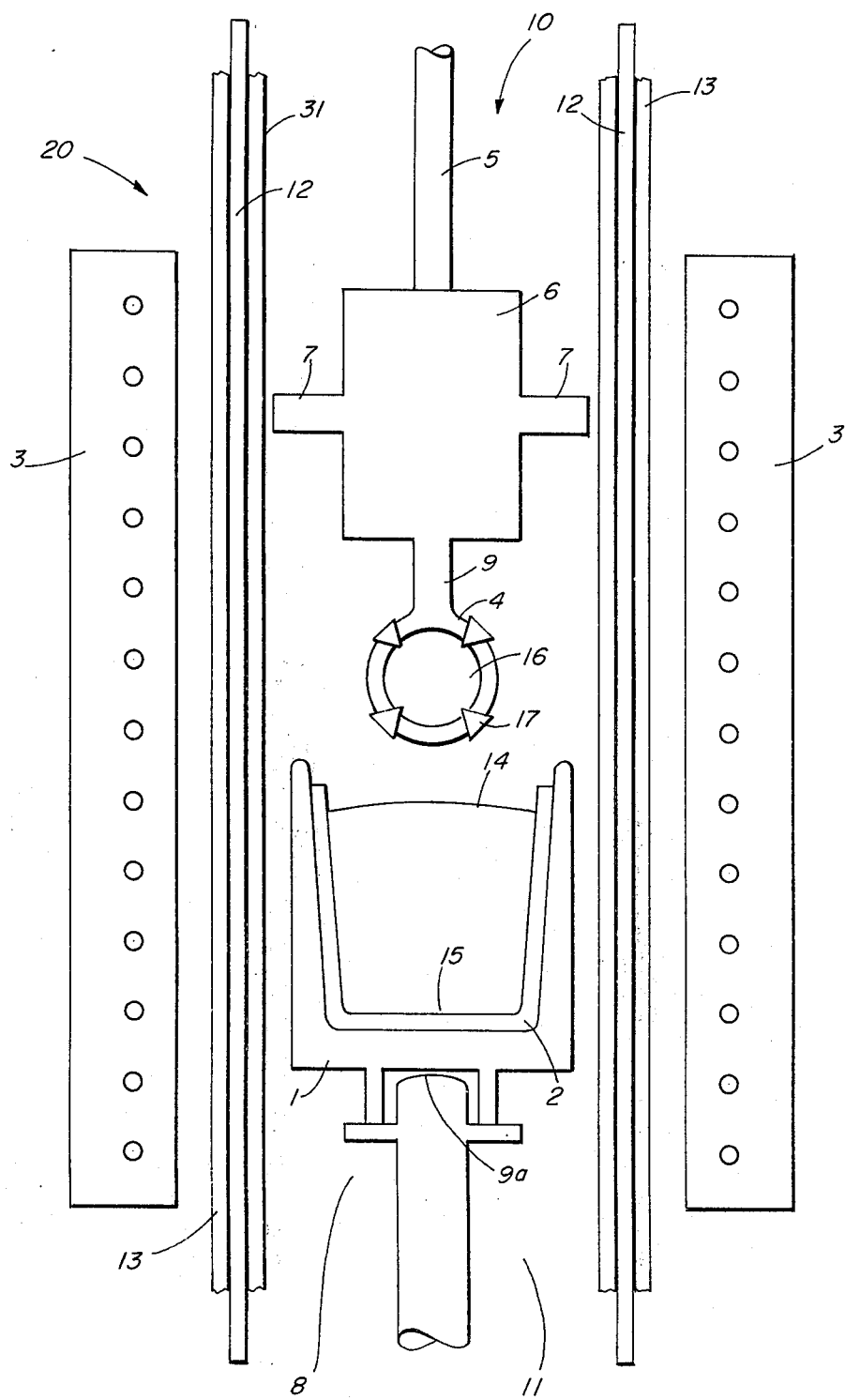

METHOD FOR GROWING THIN EPITAXIAL LAYERS OF A NON-LINEAR, OPTICALLY ACTIVE MATERIAL

BACKGROUND OF THE INVENTION

The invention is concerned with the growth of single crystal epitaxial layers of compounds represented by the formula $MNO_3$ and solid solutions of two such compounds, where M represents an alkali metal, and N is either niobium (Nb) or tantalum (Ta). The single crystal epitaxial layers are deposited upon a single crystal substrate which also is represented by the formula $MNO_3$.

Integrated optics is an area which has witnessed increased developmental activity because it offers the prospect of inexpensively producing efficient optical devices. Furthermore, integrated optics offers the potential of practically producing fiber optic communication systems. A key element in this emerging technology is the ability to produce thin waveguide layers of specific compositions and thicknesses in a reproducible manner. A waveguide layer is a thin layer (having a thickness on the order of the wavelength of the guided light) of a non-linear, optically active material possessing a slightly greater refractive index than its surroundings. Waveguide layers of particular interest are those suitable for use at wavelengths of 1.06 microns.

Single crystals of $MNO_3$, in general, and more specifically $LiNbO_3$ and $LiTaO_3$ have generated much interest because these crystals are non-linear, optically active materials exhibiting low optical absorption (preventing large losses) at 1.06 microns, the wavelength of interest. Two methodologies, in particular, have been employed to process such bulk single crystals to achieve the resultant structure of a thin waveguide layer possessing a slightly larger refractive index than the bulk crystal.

One such technique is an out diffusion process which consists of heating a $LiNbO_3$ or a $LiTaO_3$ single crystal at 1100° C, in vacuum, for periods from about 1 to 5 days. During this high-temperature vacuum exposure, out diffusion occurs at and near the surface of the crystal toward the bulk or body of the crystals. It has been hypothesized that the weaker bonded, smaller lithium atom will tend to diffuse more rapidly than the niobium or tantalum atoms. As a result, the region of material adjacent to the surface becomes depleted in lithium, compared to the bulk, resulting in a change in the refractive index of this thin layer. Since depletion of lithium results in a higher refractive index, a positive waveguide layer is produced. Weight gain measurements indicate, however, that lithium (hypothetically in the form of $Li_2O$) is not the only species removed from the thin surface layer. Thus it appears that this technique does not provide the proper control over the resultant composition of the bulk crystal. This is significant because in actual application, optical properties of both the bulk crystal and the thin waveguide layer must be carefully controlled, which involves, at a minimum, definition and control of the composition of the bulk crystal and of the thin waveguide layer.

A distinctly different method, which has been utilized to produce a thin epitaxial waveguide layer of $LiNbO_3$ on a $LiTaO_3$ substrate, employs melting a charge of $LiNbO_3$ positioned upon a $LiTaO_3$ substrate. This requires heating the substrate and overlying charge to a temperature exceeding the melting temperature of the $LiNbO_3$, but below the melting temperature of the $LiTaO_3$ substrate. Thereafter, the temperature is reduced at a rate of about 20° C/hour, until the $LiNbO_3$ is solidified. Typically, the temperature is raised to about 1300° C, or approximately 50° C above the melting temperature of $LiNbO_3$ and about 250° C below the melting temperature of the $LiTaO_3$. This technique is referred to by those familiar in this art as expitaxy-grown-by-melting (EGM). Because of the fortuitous relationship between the melting temperatures of these two constituent compounds, EGM can be employed to produce an epitaxially grown layer of $LiNbO_3$ single crystal on a $LiTaO_3$ substrate. However, this technique requires operation at significantly elevated temperatures, with all the attendant physical difficulties and drawbacks. Furthermore, subjecting the crystals to high temperature increases the potential of damaging the crystals by thermal shock, and the necessity of cooling the heterogeneous resultant structure over a large temperature differential can result in thermal expansion mismatch stresses. Also, in practical applications, it is desirable to tailor the index of refraction difference between the layer and substrate to obtain the desired waveguide effects. This can be achieved by using a solid solution of $LiTaO_3$ — $LiNbO_3$ in lieu of the overlying $LiNbO_3$ charge. However, as $LiTaO_3$ is added to the $LiNbO_3$, the melting temperature of the overlying charge increases upward toward the melting temperature of the $LiTaO_3$, and indeed a distinct melting temperature no longer exists, but is replaced by a melting range. This is detrimental to the process in that higher temperatures will be required and, upon solidification of the melt, segregation will occur.

OBJECTS OF THE INVENTION

It is an object of this invention to provide a novel process for growing thin epitaxial films on single crystal substrates.

It is a further object of the present invention to provide a process for growing a non-linear, optically active epitaxial film on a suitable substrate such that the refractive index of the epitaxial film is slightly greater than that of the substrate, the film has low optical absorption and a uniform thickness in the order of a wavelength of the guided light.

These and still further objects, features and advantages of the present invention will be more apparent from a consideration of the following, more detailed explanation of the present invention.

SUMMARY OF THE INVENTION

These and still further objects, features and advantages of the present invention are achieved, in accordance therewith by heating a solution of an alkali metal halide solvent and at least one oxide compound represented by the formula $MNO_3$ where M represents an alkali metal, and N is either niobium or tantalum, to an elevated temperature to produce a saturated condition with excess oxide remaining undissolved in the alkali halide solvent, slowly removing by evaporation a portion of the solvent to leave the solution in a supersaturated condition, bringing a substrate heated to approximately the temperature of the solution into contact with the solution whereby crystal growth occurs upon said substrate, and removing the substrate from the solution after a predetermined interval during which a thin epitaxial layer has been deposited onto the substrate. In this process, volatilization of the solvent results in a super-saturated condition, causing deposition and growth of the oxide compound, or solid solution of oxide compounds, upon the substrate. As the growth occurs, additional solute dissolves in the solvent to replenish the deposited material. This replenishment is achieved by maintaining a portion or zone of the solute at a temperature several degrees above that of the region where epitaxial growth is occurring. Thus the present invention describes epitaxial growth utilizing a liquid phase-epitaxial growth process in which the oxide solutes are dissolved in an alkali metal halide solvent, and the growth process is controlled by solvent volatilization. The use of alkali metal halide solvents, with their specific oxide solubility relationships, vaporization rates, diffussivities, and melting temperatures, allow for conducting the process at relatively reduced temperatures, while permitting sufficient control in varying the composition of the thin film epitaxial layer.

Alkali metal halides suitable for use as solvents in the process of this invention include lithium chloride, lithium fluoride, lithium bromide, lithium iodide, sodium chloride, sodium fluoride, sodium bromide, sodium iodide, potassium chloride, potassium fluoride, potassium bromide, and potassium iodide, with lithium chloride and lithium fluoride presently being preferred. However, it is presently considered desirable to match the alkali metal of the alkali metal halide with the alkali metal of the oxide being deposited (e.g., lithium chloride solvent with a $LiNbO_3$ solute) so as to avoid the formation of undesirable additional reaction product species.

As set forth above, the process of this invention is applicable to the growth of epitaxial layers of oxide represented by the formula $MNO_3$, where M is an alkali metal, and N is either niobium or tantalum. In addition, the process is also applicable to solid solutions or mixed crystals represented by formulas of the type $M_xM'_{(1-x)}NO_3$ and $MN_xN'_{(1-x)}O_3$, where M and M' are alkali metals, and N and N' are niobium and tantalum. In particular, the method of this invention can be employed to grow thin epitaxial layers of $LiNbO_3$ and $LiNb_xTa_{(1-x)}O_3$ on lithium tantalate substrates, or $Li_xNa_{(1-x)}NbO_3$ and $Li_xK_{(1-x)}NbO_3$ on lithium niobate substrates, where $x$ is greater than 0 and less than 1. Such thin epitaxial layers have a refractive index which is slightly greater than that of the substrate and both the substrate and epitaxial layer possess low optical absorption at 1.06 microns, the wavelength of interest. These properties make the devices produced according to the process of this invention suitable for use as electro-optic modulators and waveguides, and, for example, integrated optical communication systems.

In the practice of this invention, a suitable substrate, which can also be of the form $MNO_3$, is held in position just above the melt to allow it to approach thermal equilibrium with the molten saturated solution, having excess undissolved solute therein. When thermal equilibrium is reached, the substrate is lowered into the solution and, because of the super-saturated condition resulting from evaporation or volatilization of the alkali metal halide, growth of the thin epitaxial layer occurs. As deposition occurs, more of the solvent is removed by evaporation, thereby maintaining the super-saturated state necessary for deposition upon the substrate. Optionally, or in combination with solvent evaporation, additional solute can be transferred to the growth region to replenish the supply of solute which is deposited upon the single crystal substrate. This can be achieved by maintaining a zone of excess undissolved solute (nutrient region) in the melt at a temperature several degrees above that of the region where epitaxial growth is occurring, thereby causing a concentration gradient to be imposed in the solution. In effect, the growth region is continually replenished with solute by diffusion (due to the concentration gradient) and by the dissolving of additional solute as needed during the deposition process.

In an exemplary embodiment of the method of this invention, thin epitaxial single crystal layers of $LiNbO_3$ were grown on polished $LiTaO_3$ substrates. Powdered $LiNbO_3$ was added to anhydrous LiCl, and the temperature was raised in an inert gas atmosphere resulting in a saturated solution of $LiNbO_3$ in the LiCl. A $LiTaO_3$ substrate was introduced into the solution and maintained there under constant thermal conditions at 950° C for two hours, and then removed. Weight gain of the substrate amounted to about 0.7 mg over a substrate area of approximately 1.3 $cm^2$, yielding an average layer thickness of about 1 micrometer. The epitaxial layer was clear, transparent and appeared to be uniform with regard to its thickness and crystal quality as observed during postfabrication microscopic examination.

In a further exemplary embodiment, the temperature was initially equilibrated at about 1100° C, the $LiTaO_3$ substrate introduced into intimate contact with the solution, and the temperature of the solution slowly cooled at a rate of about 1° C/minute. This was continued until the temperature reached about 900° C, resulting in an average layer thickness of about 13 micrometers.

A principal feature of the method of this invention is the use of an alkali metal halide as the solvent for the material to be deposited, and the gradual removal by volatilization or evaporation, of a portion of the solvent to maintain a super-saturated condition which fosters the growth process. A constant solvent volatilization rate and condensation of the solvent vapors below the crucible serve to control the deposition process and extend the useful life of the component parts of the apparatus described in greater detail below with respect to the FIGURE appended hereto.

As set forth above, the epitaxy-growth-by-melting (EGM) process requires temperatures of at least 1250° C as contrasted with the maximum operating temperature of about 1100°C for the method of this invention. This epitaxial process avoids heating the single crystal film through ferroelectric transition which occurs at a temperature below the melting point of the single crystal film but above 1100° C. This also reduces the possibility of damaging the single crystal substrate during the growth process. In addition, the various quartz, graphite and platinum components of the apparatus to be described below have enhanced stability at the lower temperatures thereby eliminating the need for replacing complex and expensive components to be employed in the apparatus necessary for conducting the process described herein.

The process of this invention is also an improvement on the out diffusion method described above, which, although requiring heating to only about 1100° C, does not maintain proper stoichiometric control necessary for the production of uniform layers which permit, in turn, the detailed tailoring of the waveguide properties of the resultant structure.

A further advantage of the method of this invention is the applicability of producing a product having a solid solution of two compounds, for example, a solid solution of LiNbO$_3$ and LiTaO$_3$ on a LiTaO$_3$ substrate. This is achieved by dissolving excess amounts of two applicable solutes in the alkali metal halide solvent and conducting the process as set forth above. Since the solubility of the solutes are functions of temperature, the specific resultant solid solution composition will be controlled by the temperature of the solution during the deposition. Furthermore, as set forth above, if the temperature is changed during the course of epitaxial deposition, then the composition of the epitaxial layer will be varied. Thus, by slowly cooling the temperature of the solution, in a smooth and continuous fashion, a graded composition of the thin epitaxial layer can be achieved.

The proper selection of the substrate, the single crystal epitaxial layer to be deposited and control of the process parameters during deposition, will result in a thin epitaxial layer having a refractive index which is slightly greater than that of the single crystal substrate. Such structures will be useful as thin film waveguides and electro-optic modulators suitable for use as components of an integrated optical communication system.

BRIEF DESCRIPTION OF THE DRAWING

The FIGURE attached hereto is a representative of a vertical growth system for conducting the method of this invention.

Referring to the FIGURE there is shown a vertical growth system 20 having a graphite outer crucible 1 lined with an inner platinum crucible 2, all situated within furnace 3. Substrate holder 4 is fabricated out of platinum and is connected to the end of a quartz tube 5. Substrate holder 4 has a main support 6 of graphite having a baffle positioned in such a manner that, in conjunction with the helium gas flow through the apparatus, the vapors of the alkali metal halide solvent are directed to and condense out in the region 8 below the crucible. This condensation below the crucible aids in maintaining a constant volatilization rate, and in preventing condensation of the vapors on certain component parts of the apparatus, which, if allowed to occur, could degrade the usefulness of these component parts, as well as inhibit the ease with which the substrate or crucible could be inserted or unloaded in the system. Thermocouple 9 adjacent substrate holder 4 and thermocouple 9a adjacent the crucible are used to monitor and control the temperature of the system. Purified helium gas is introduced into the system at inlet 10, exiting at outlet 11. The reaction zone adjacent the crucible is maintained within a platinum liner 31 which is inside the quartz liner 12 and the entire system is enclosed within a quartz jacket 13. Contained within platinum crucible 2 is a quantity of alkali metal halide solvent 14 in which is dissolved the oxide material to be deposited during the epitaxial deposition process. Excess oxide solute 15 is at the bottom of the platinum crucible 2. Substrate 16 upon which the thin epitaxial film is to be deposited is held by substrate holder 4 having clamping mechanism 17. When equilibrium is established, the substrate is lowered into the crucible and maintained there for the desired period of time to deposit a predetermined thickness of waveguide layer on substrate 16.

DESCRIPTION OF SPECIFIC EMBODIMENTS

The following Examples are given to enable those skilled in this art to more clearly understand and practice this invention. They should not be considered a limiation upon the scope of the invention but merely as being illustrative and representative thereof.

EXAMPLE I

A thin epitaxial layer approximately 1 micrometer thick of lithium niobate was grown on a lithium tantalate substrate using the apparatus represented in the FIGURE.

A lithium tantalate substrate was mechanically polished and cleaned in organic solvents and air dried. The wafer was then further processed to remove surface damage by immersion in a chemical solution of sulfuric acid and phosphoric acid.

Referring to the FIGURE, the process substrate was placed onto substrate holder 4. A 20 gm charge of anhydrous lithium chloride and lithium niobate consisting of 1 mole % lithium niobate (with the remainder lithium chloride) was carefully weighed in a dry nitrogen environment. The powders were transferred to a vacuum drying oven and dried for 24 hours at 100° C in a 20 cc, 5 mil thick platinum crucible. The platinum crucible containing the lithium niobate-lithium chloride powder and the process substrate were assembled into the apparatus as shown in the FIGURE.

Helium is introduced into the reaction chamber and the furnace heat-up cycle is initiated. Heat up is done gradually to prevent wafer cracking. The temperature of the molten lithium chloride is stabilized at 950° C. After thermal stability is achieved, the substrate is lowered into the molten solution. The thermal gradient between the undissolved lithium niobate solute and the substrate is maintained at 4° C/cm. The substrate is kept in intimate contact with the solution under these controlled conditions for about 2 hours and then removed from the crucible. After the furnace had cooled to room temperature the sample was removed from the system and rinsed thoroughly in water to dissolve the solvent. The resultant structure comprises a 1 micrometer thick epitaxial layer of lithium niobate on the lithium tantalate substrate.

EXAMPLE II

The procedure of EXAMPLE I is repeated except the lithium choride-lithium niobate charge consists of 10 mole % lithium niobate in 90 mole % lithium chloride, and the temperature was initially stabilized at 1100° C before the substrate was lowered into the molten solution. A cooling rate of 1° C/minute was employed until a temperature of 900° C was achieved as opposed to the isothermal conditions of EXAMPLE I. This process resulted in a 13 micrometer thick single crystal epitaxial layer of lithium niobate being grown onto the lithium tantalate substrate.

EXAMPLES III — VIII

In these Examples thin epitaxial layers of lithium niobatelithium tantalate solid solutions were grown. Preparatory procedures were similar to those of Example I, with the major exception that the crucible charge contained 1 wt. percent lithium tantalate, 5 wt. percent lithium niobate, and 94 wt. percent lithium chloride. The solution was heated to the growth temperature and the 1.3 square centimeter area lithium tantalate substrate, prepared in a manner similar to that of Example I, was introduced into the solution. Growth was carried out isothermally for various times at various temperatures, resulting in successful deposition of a thin epitaxial layer. In the Table I below, the temperature of growth, growth duration and weight gain of the substrate are tabulated. In general, samples in which growth occurred at higher temperatures appeared to have less defect structure in the film as revealed by microscopic examination and etching. This would be in accordance with the theory that at higher temperatures the solubility of lithium tantalate becomes sufficient such that the growth product would contain significant amounts of lithium tantalate in solid solution with lithium niobate. As a result, increasing the solid solution content of lithium tantalate in the growth product decreases the lattice and thermal expansion mismatch between the substrate and the growth layer, in turn resulting in less strain at the substrate-epilayer interface. At lower temperatures (near 900° C), however, lithium niobate is much more soluble than lithium tantalate, thus the growth product would be expected to be almost pure lithium niobate.

TABLE I

| EXAMPLE NO. | TEMPERATURE OF GROWTH (° C) | GROWTH DURATION (HRS.) | SAMPLE WEIGHT GAIN (mg.) |
| --- | --- | --- | --- |
| III | 900 | 3 | 0.65 |
| IV | 950 | 3 | 1.15 |
| V | 1000 | 3 | 1.8 |
| VI | 1000 | 1 | 0.56 |
| VII | 1000 | 2 | 1.1 |
| VIII | 900 | 5 | 1.15 |

What is claimed is:
1. A method for growing thin single crystal epitaxial layers of a non-linear, optially active material on a lithium tantalate or lithium niobate substrate comprising:
   a. providing a solution of said non-linear, optically active material represented by the formula $M_xM'_{(1-x)}NO_3$ or $MN_xN'_{(1-x)}O_3$, where M and M' are independently alkali metals, and N and N' are independently niobium and tantalum and x can be any value from 0 to 1, inclusive, in a molten alkali metal halide solvent;
   b. heating said solution to an elevated temperature to produce saturation of said non-linear, optically active material in said solvent, with an excess of said non-linear, optically active material remaining undissolved in said solvent;
   c. slowly evaporating a portion of said solvent to induce a super-saturated condition in said solution;
   d. heating said substrate to a temperature approximately equal to that of said solution;
   e. bringing said substrate into contact with said solution; and
   f. removing said substrate from said solution after a predetermined time interval during which said thin single crystal epitaxial layer of said non-linear, optically active material has been deposited upon said substrate.
2. The method of claim 1 wherein said thin single crystal epitaxial layer of said non-linear, optically active material is deposited onto said substrate while said solution is maintained at a constant temperature.
3. The method of claim 1 wherein said thin single crystal epitaxial layer of said non-linear, optically active material is deposited onto said substrate while said solution is slowly cooled at a uniform rate.
4. The method of claim 1 wherein said substrate is lithium tantalate.
5. The method of claim 1 wherein said non-linear, optically active material is either lithium niobate or lithium tantalate.
6. The method of claim 1 wherein said alkali metal halide solvent is lithium chloride.
7. The method of claim 1 wherein said non-linear, optically active material comprises a solid solution or mixed crystal of lithium niobate and lithium tantalate.
8. The method of claim 1 wherein said solution and said substrate are heated to a temperature in the range of about 950° C to about 1100° C.
9. The method of claim 1 further including the step of
   g. maintaining said super-saturated condition by continued volatilization of further solvent material.
10. The method of claim 1 further including the step of
    h. dissolving a portion of said excess, undissolved non-linear, optically active material to thereby replenish the supply of said non-linear, optically active material which has been deposited upon said substrate.
11. The method of claim 10 wherein step (h) is accomplished by maintaining a zone of excess, undissolved non-linear, optically active material in said solution at a temperature slightly higher than the region where said epitaxial growth upon said substrate is occurring.
12. The method of claim 1 further including the steps of
    g. maintaining said super-saturated condition by continued volatilization of further solvent material, and
    h. dissolving a portion of said excess, undissolved non-linear, optically active material to thereby replenish the supply of said non-linear, optically active material which has been deposited upon said substrate.
13. The method of claim 12 wherein step (h) is accomplished by maintaining a zone of excess, undissolved non-linear, optically active material in said solution at a temperature slightly higher than the region where said epitaxial growth upon said substrate is occurring.
14. The method of growing a thin epitaxial layer of lithium niobate on a lithium tantalate substrate comprising:
    a. heating a solution of lithium niobate in lithium chloride to a temperature within the range of about 900° C to about 1100° C to produce a saturated solution of lithium niobate in lithium chloride, with an excess of lithium niobate remaining undissolved in said lithium chloride;

b. slowly evaporating a portion of said lithium chloride to induce a super-saturated condition in said solution;
c. heating said lithium tantalate substrate to a temperature closely approximating that of said solution;
d. bringing said heated lithium tantalate substrate into contact with said solution of lithium niobate in lithium chloride;
e. removing said substrate after a predetermined time interval during which said thin epitaxial layer of lithium niobate has been deposited upon said lithium tantalate substrate.

15. The method of claim 14 wherein said solution further includes quantities of lithium tantalate, thereby resulting in a thin epitaxial layer of a solid or mixed crystal solution of lithium niobate and lithium tantalate being deposited upon said lithium tantalate substrate.

16. The method of claim 14 wherein said solution is maintained at isothermal conditions during said predetermined time interval.

17. The method of claim 14 wherein during said predetermined time interval said solution is slowly cooled at a uniform rate.

18. The method of claim 17 wherein said solution further includes a quantity of lithium tantalate thereby resulting in a thin epitaxial layer of a solid or mixed crystal solution of lithium niobate and lithium tantalate having a graded composition being deposited upon said lithium tantalate substrate.

19. The method of claim 14 further incuding the step of f. maintaining said super-saturated condition by continued volatilization of further solvent material.

20. The method of claim 14 further including the step of g. dissolving a portion of said excess, undissolved non-linear, optically active material to thereby replenish the supply of said non-linear, optically active material which has been deposited upon said substrate.

21. The method of claim 20 wherein step (g) is accomplished by maintaining a zone of excess, undissolved non-linear, optically active material in said solution at a temperature slightly higher than the region where said epitaxial growth upon said substrate is occurring.

22. The method of claim 14 further including the steps of f. maintaining said super-saturated condition by continued volatilization of further solvent material, and g. dissolving a portion of said excess, undissolved non-linear, optically active material to thereby replenish the supply of said non-linear, optically active material which has been deposited upon said substrate.

23. The method of claim 22 wherein step (g) is accomplished by maintaining a zone of excess, undissolved non-linear, optically active material in said solution at a temperature slightly higher that the region where said epitaxial growth upon said substrate is occurring.

* * * * *